(12) United States Patent
Schindler et al.

(10) Patent No.: US 11,598,789 B2
(45) Date of Patent: Mar. 7, 2023

(54) PROBE SYSTEMS CONFIGURED TO TEST A DEVICE UNDER TEST AND METHODS OF OPERATING THE PROBE SYSTEMS

(71) Applicant: FormFactor, Inc., Livermore, CA (US)

(72) Inventors: Martin Schindler, Kurort Hartha (DE); Stefan Kreissig, Drebach (DE); Torsten Kiel, Dresden (DE)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 17/506,081

(22) Filed: Oct. 20, 2021

(65) Prior Publication Data

US 2022/0236303 A1     Jul. 28, 2022

Related U.S. Application Data

(60) Provisional application No. 63/142,203, filed on Jan. 27, 2021.

(51) Int. Cl.
    *G01R 1/067*      (2006.01)
    *G01R 31/00*      (2006.01)
    *G01R 1/073*      (2006.01)

(52) U.S. Cl.
    CPC ......... *G01R 1/06794* (2013.01); *G01R 1/073* (2013.01); *G01R 31/003* (2013.01)

(58) Field of Classification Search
    CPC .. G01R 1/06794; G01R 1/073; G01R 31/003; G01R 31/2881; G01R 31/2891
(Continued)

(56) References Cited

U.S. PATENT DOCUMENTS

| | | | |
|---|---|---|---|
| 7,586,608 B1* | 9/2009 | Gunn, III | G02B 6/274 356/399 |
| 10,060,950 B2 | 8/2018 | Simmons et al. | |

(Continued)

FOREIGN PATENT DOCUMENTS

| | | |
|---|---|---|
| CN | 102353817 A | 2/2012 |
| CN | 111811939 A | 10/2020 |
| JP | H09-257811 A | 10/1997 |

OTHER PUBLICATIONS

English-language machine translation of JPH09-257811A, Canon Inc.; Oct. 3, 1997.

(Continued)

*Primary Examiner* — Farhana A Hoque
(74) *Attorney, Agent, or Firm* — Kolitch Romano Dascenzo Gates LLC

(57) ABSTRACT

Probe systems configured to test a device under test and methods of operating the probe systems are disclosed herein. The probe systems include an electromagnetically shielded enclosure, which defines an enclosed volume, and a temperature-controlled chuck, which defines a support surface configured to support a substrate that includes the DUT. The probe systems also include a probe assembly and an optical microscope. The probe systems further include an electromagnet and an electronically controlled positioning assembly. The electronically controlled positioning assembly includes a two-dimensional positioning stage, which is configured to selectively position a positioned assembly along a first two-dimensional positioning axis and also along a second two-dimensional positioning axis. The electronically controlled positioning assembly also includes a first one-dimensional positioning stage that operatively attaches the optical microscope to the positioned assembly and a (Continued)

second one-dimensional positioning stage that operatively attaches the electromagnet to the positioning assembly.

20 Claims, 6 Drawing Sheets

(58) Field of Classification Search
USPC .................................................. 324/750.14
See application file for complete search history.

(56) References Cited

U.S. PATENT DOCUMENTS

2007/0096763 A1   5/2007   Ehrmann et al.
2020/0025823 A1   1/2020   Teich et al.

OTHER PUBLICATIONS

English-language machine translation of CN102353817A, Suzhou Institute; Feb. 15, 2012.
English-language machine translation of CN111811939A, Shanghai Jiaotong University; Oct. 23, 2020.

* cited by examiner

PROBE SYSTEMS CONFIGURED TO TEST A DEVICE UNDER TEST AND METHODS OF OPERATING THE PROBE SYSTEMS

RELATED APPLICATION

This application claims priority to U.S. Provisional Patent Application No. 63/142,203, which was filed on Jan. 27, 2021, and the complete disclosure of which is hereby incorporated by reference.

FIELD OF THE DISCLOSURE

The current disclosure relates generally to probe systems configured to test a device under test (DUT) and/or to methods of operating the probe systems and more particularly to such probe systems and/or methods that include an electromagnet configured to apply a magnetic field to the DUT.

BACKGROUND OF THE DISCLOSURE

Probe systems may be utilized to test and/or to quantify the operation and/or performance of a device under test (DUT), examples of which include a semiconductor device, a solid state device, an electrical device, an optical device, and/or an optoelectronic device. For some DUTs, it may be desirable to perform such tests while the DUT is subject to, or experiences, a magnetic field. While probe systems configured to apply a magnetic field to the DUT have been developed, these probe systems generally are slow to operate and/or are unable to apply a precisely controlled magnetic field to the DUT. Thus, there exists a need for improved probe systems configured to test a device under test and/or for methods of operating the probe systems.

SUMMARY OF THE DISCLOSURE

Probe systems configured to test a device under test and methods of operating the probe systems are disclosed herein. The probe systems include an electromagnetically shielded enclosure, which defines an enclosed volume, and a temperature-controlled chuck, which defines a support surface configured to support a substrate that includes the DUT. The support surface is positioned within the enclosed volume. The probe systems also include a probe assembly, an optical microscope, an electromagnet, and an electrically controlled positioning assembly. The probe assembly includes a plurality of probes configured to provide a test signal to the DUT and/or receive a resultant signal from the DUT. The optical microscope is configured to collect a microscope optical image of the DUT along a microscope optical axis that is directed toward the support surface. The electromagnet is configured to selectively apply a magnetic field to the DUT. The electronically controlled positioning assembly includes a two-dimensional positioning stage, which is configured to selectively position a positioned assembly along a first two-dimensional positioning axis and also along a second two-dimensional positioning axis that is at least substantially perpendicular to the first two-dimensional positioning axis. Both the first two-dimensional positioning axis and the second two-dimensional positioning axis are at least substantially parallel to the support surface. The electronically controlled positioning assembly also includes a first one-dimensional positioning stage that operatively attaches the optical microscope to the positioned assembly and is configured to selectively position the optical microscope along a first one-dimensional positioning axis that is at least substantially perpendicular to the support surface. The electronically controlled positioning assembly further includes a second one-dimensional positioning stage that operatively attaches the electromagnet to the positioned assembly and is configured to selectively position the electromagnet along a second one-dimensional positioning axis that is at least substantially perpendicular to the support surface.

DETAILED DESCRIPTION AND BEST MODE OF THE DISCLOSURE

Figure 1:
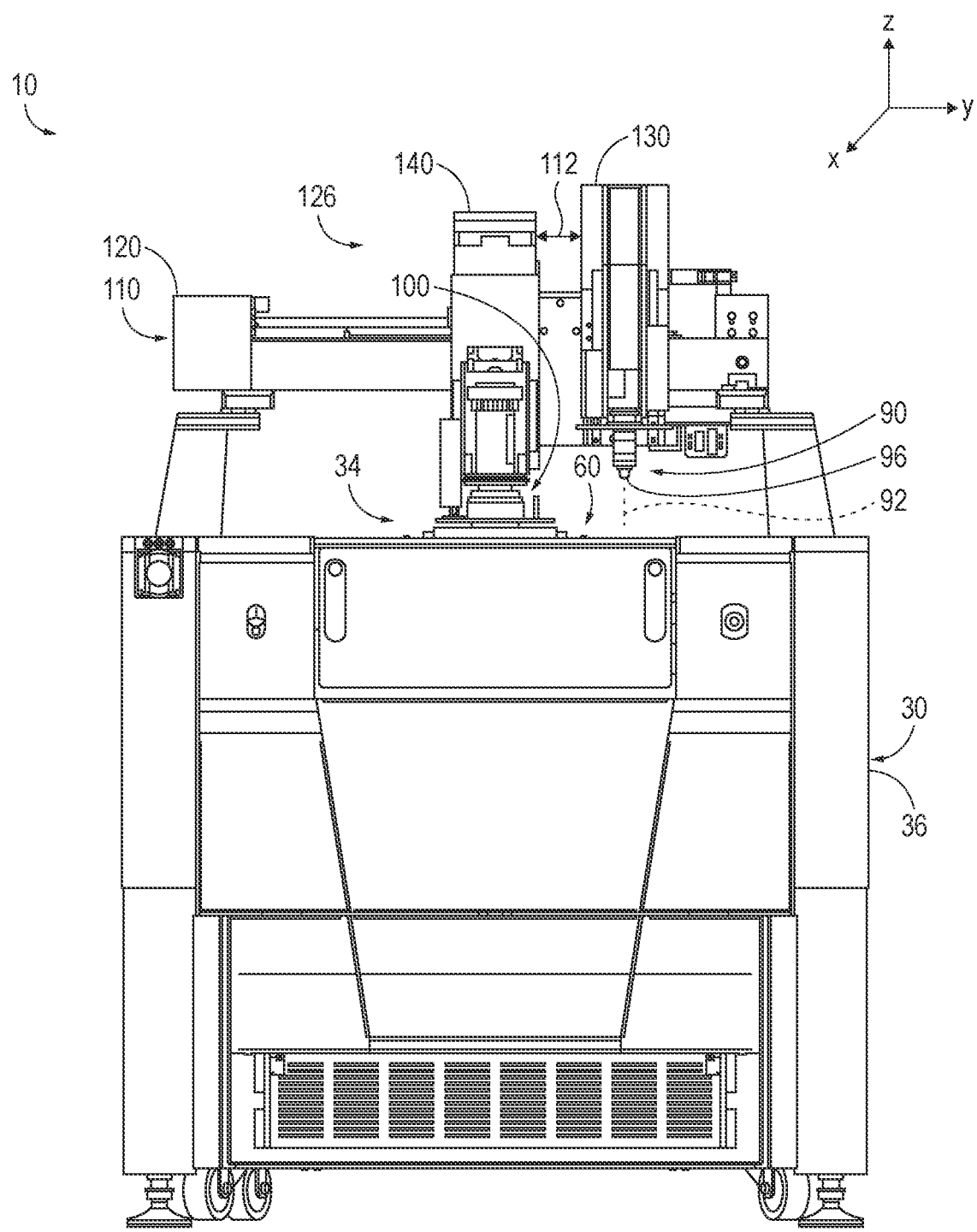
FIG. 1 is a front view of an example of a probe system according to the present disclosure.

FIGS. 1-5 provide examples of probe systems 10 and/or components and/or features thereof, according to the present disclosure. Elements that serve a similar, or at least substantially similar, purpose are labeled with like numbers in each of FIGS. 1-5, and these elements may not be discussed in detail herein with reference to each of FIGS. 1-5. Similarly, all elements may not be labeled in each of FIGS. 1-5, but reference numerals associated therewith may be utilized herein for consistency. Elements, components, and/or features that are discussed herein with reference to one or more of FIGS. 1-5 may be included in and/or utilized with any of FIGS. 1-5 without departing from the scope of the present disclosure. In general, elements that are likely to be included in a particular embodiment are illustrated in solid lines, while elements that are optional are illustrated in dashed lines. However, elements that are shown in solid lines may not be essential to all embodiments and, in some embodiments, may be omitted without departing from the scope of the present disclosure.

As collectively illustrated by FIGS. 1-5, probe systems 10 may be configured to test a device under test (DUT) 22, which may be formed on and/or supported by a substrate 20. Examples of substrate 20 include a planar substrate, which defines a planar substrate surface 24, a semiconductor substrate, and/or an optically active substrate. Examples of DUT 22 include an electronic device, a semiconductor device, an optical device, and/or an optoelectronic device.

Probe systems 10 include an enclosure 30, which also may be referred to herein as and/or may be an electromagnetically shielded enclosure 30. Enclosure 30 may form, define, surround, and/or at least partially bound an enclosed volume 32.

Probe systems 10 also include a chuck 40, which also may be referred to herein as and/or may be a temperature-controlled chuck 40. Chuck 40 may define a support surface 42, which may be shaped, sized, and/or configured to support substrate 20. Support surface 42 may be positioned within enclosed volume 32 of enclosure 30.

Figure 2:
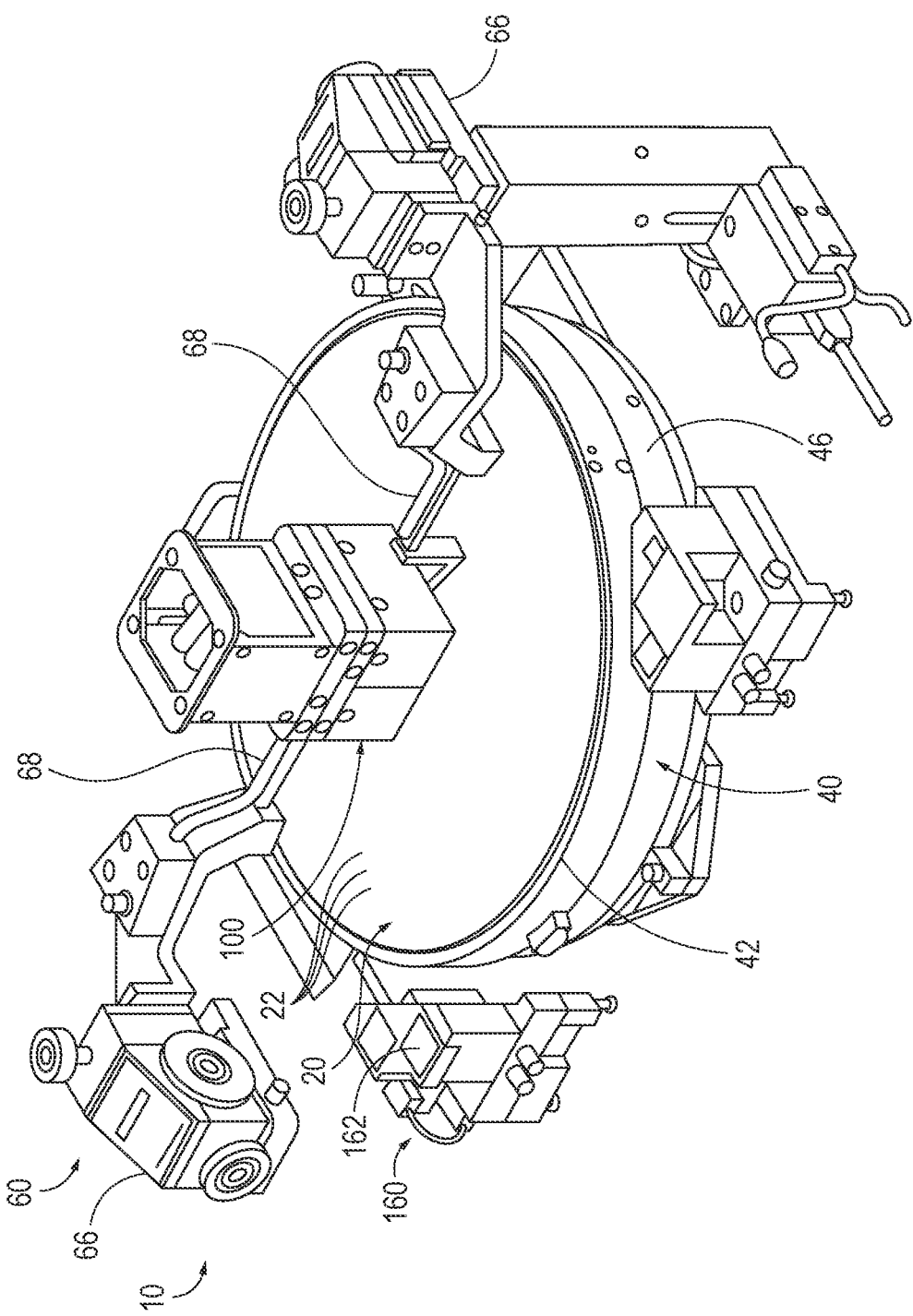
FIG. 2 is a projection view of an example of a portion of a probe system including a probe assembly in the form of a plurality of manipulators and a plurality of needle probes, according to the present disclosure.
Figure 3:
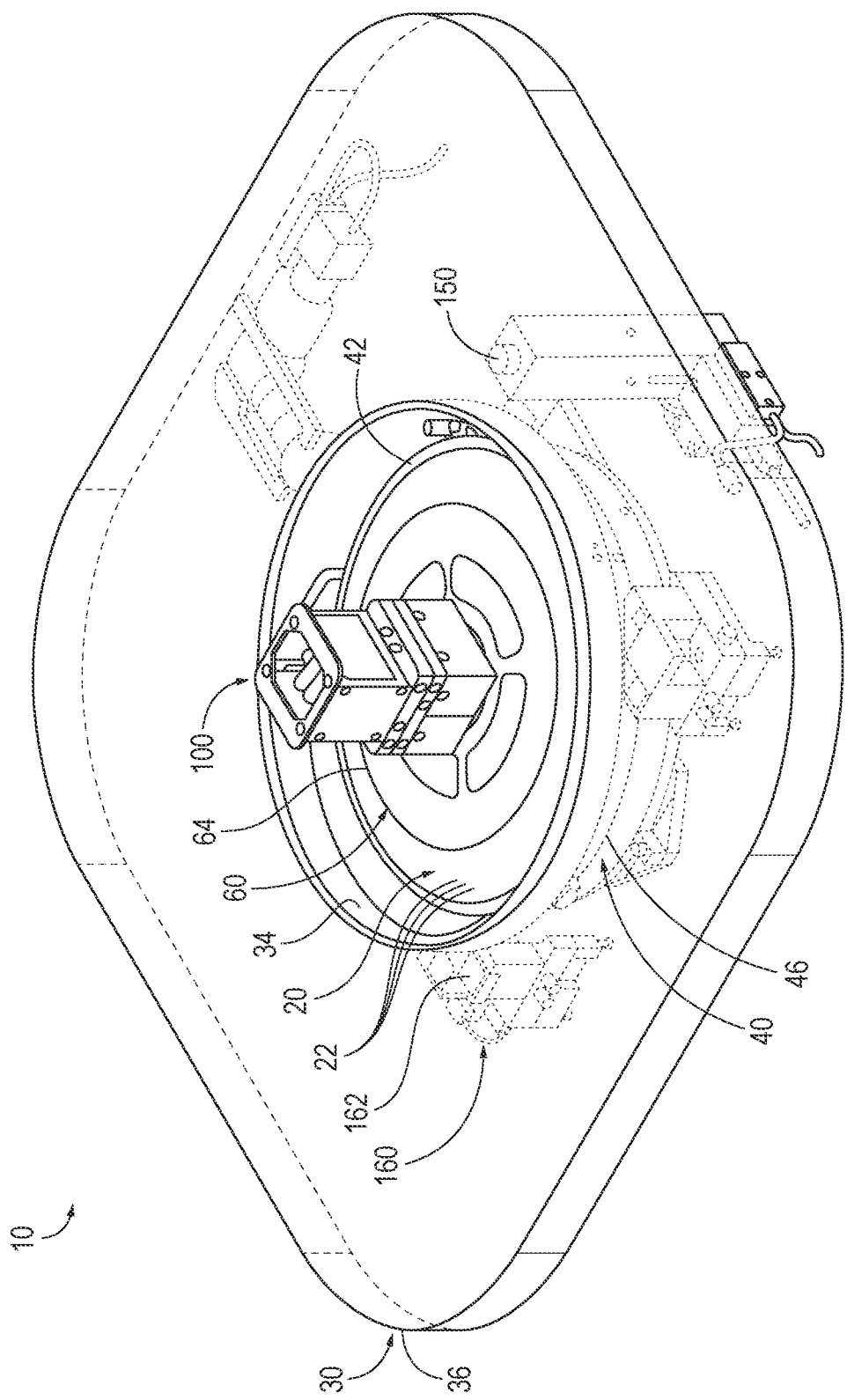
FIG. 3 is a projection view of an example of a portion of a probe system including a probe assembly in the form of a probe card, according to the present disclosure.
Figure 4:
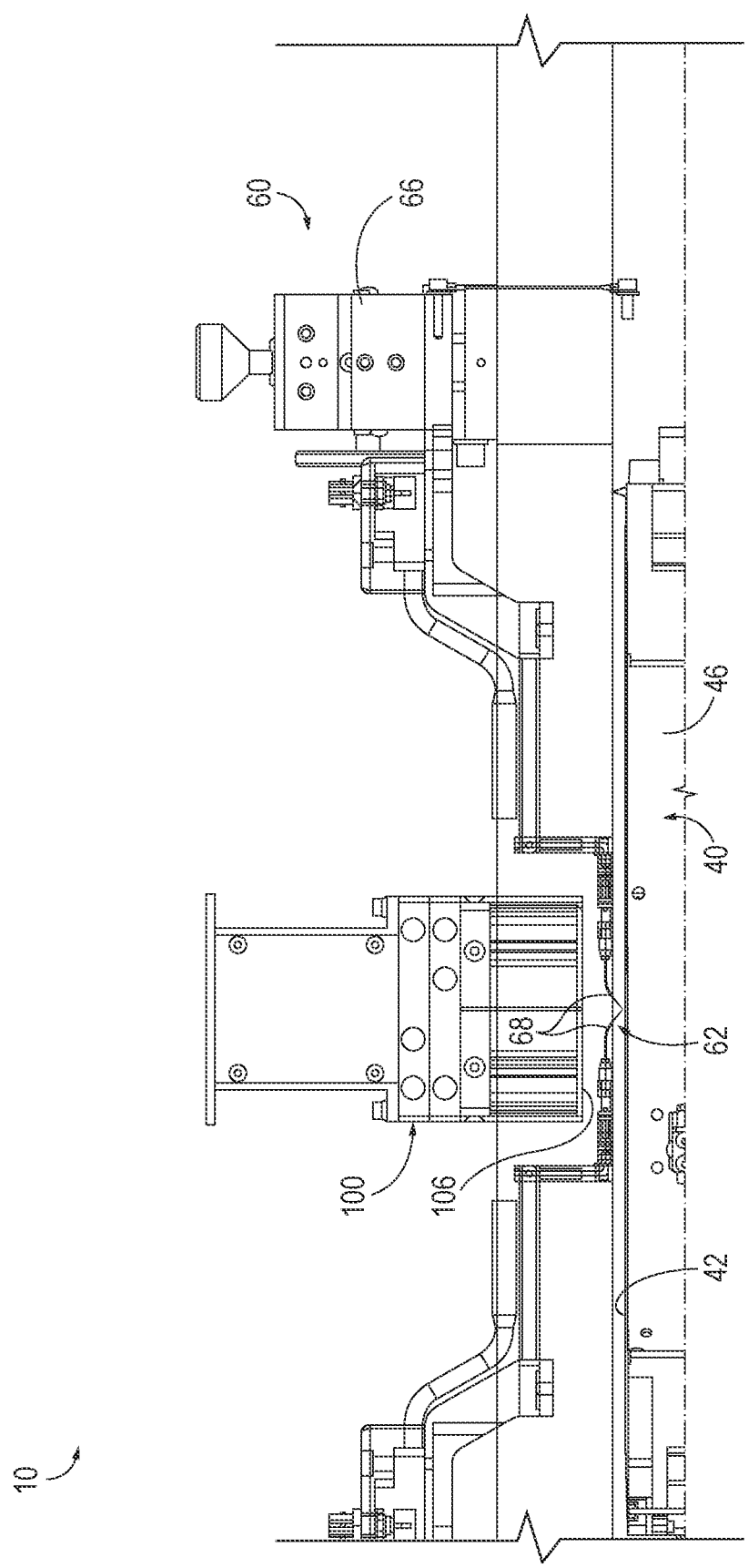
FIG. 4 is a side view of an example of a portion of a probe system including a probe assembly in the form of a plurality of manipulators and a plurality of needle probes, according to the present disclosure.
Figure 5:
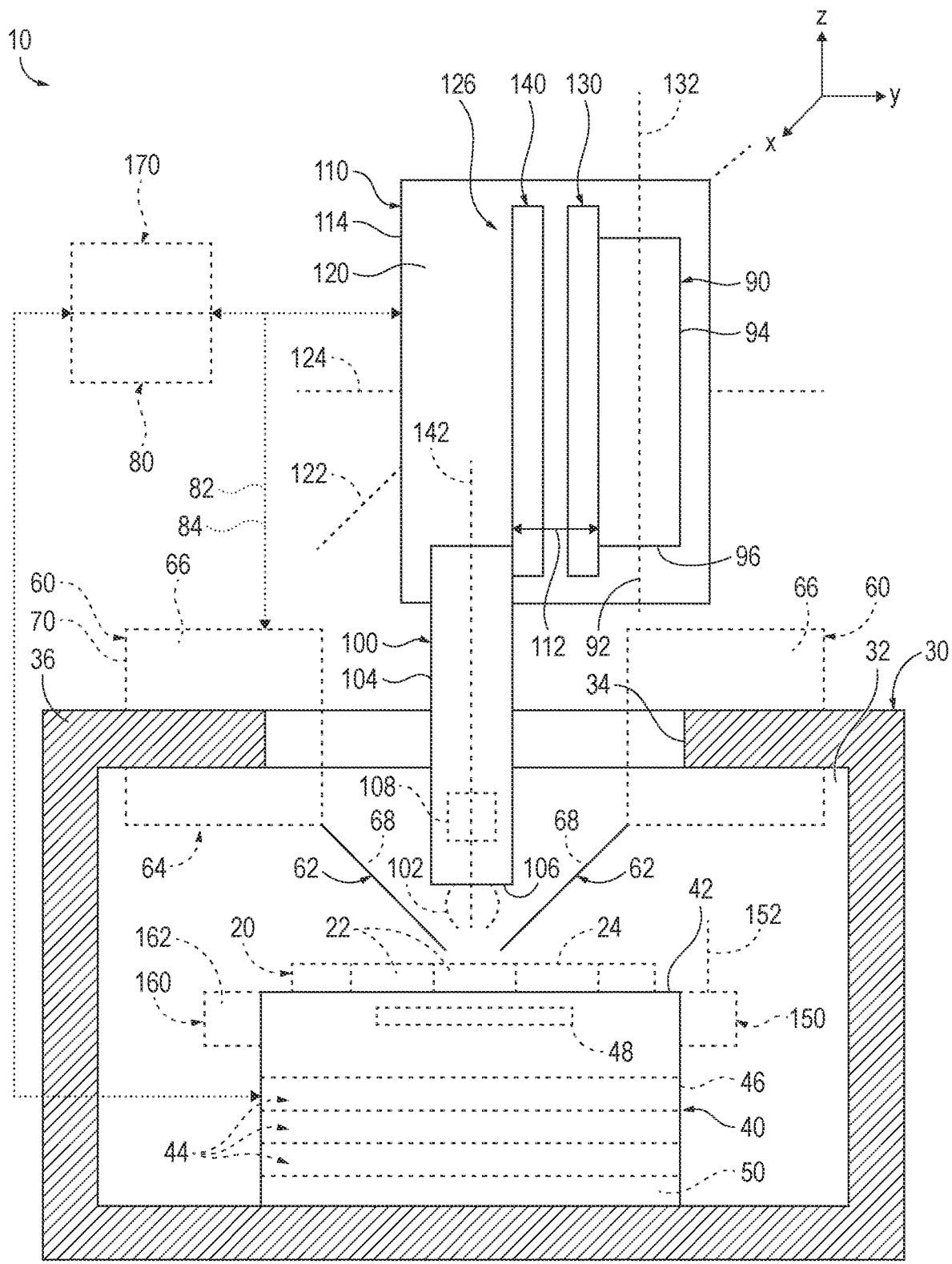
FIG. 5 is a schematic illustration of examples of a probe system according to the present disclosure.

Probe systems 10 further include a probe assembly 60. Probe assembly 60 includes a plurality of probes 62 and may be configured to provide a test signal 82 to DUT 22 and/or to receive a resultant signal 84 from the DUT. In some examples, and as illustrated in FIGS. 2 and 4-5, probe assembly 60 may include a plurality of manipulators 66 and a corresponding plurality of needle probes 68, which may include probes 62. In some examples, and as illustrated in FIGS. 3 and 5, probe assembly 60 may include a probe card 64, which also may be referred to herein as a probe card assembly 64 and/or may include probes 62. Examples of probes 62 include electrical probes and/or optical probes. Examples of manipulators 66 include one-dimensional, two-dimensional, and/or three-dimensional manipulators, which may include lead screw and nut assemblies, ball screw and nut assemblies, rack and pinion assemblies, linear actuators, and/or rotary actuators.

Probe systems 10 also include an optical microscope 90, as illustrated in FIGS. 1 and 5. Optical microscope 90 may be configured to collect a microscope optical image of DUT 22 and/or of probes 62 along a microscope optical axis 92. Microscope optical axis 92 may be directed toward support surface 42, DUT 22, and/or substrate 20. Stated another way, microscope 90 may be configured to collect light that is incident thereupon along and/or from microscope optical axis 92, from support surface 42, from DUT 22, and/or from substrate 20.

Probe systems 10 further include an electromagnet 100, as illustrated in FIGS. 1-5. Electromagnet 100 may be adapted, configured, designed, and/or constructed to apply a magnetic field 102 to DUT 22, as illustrated in FIG. 5.

Probe systems 10 also include an electrically controlled positioning assembly 110, as illustrated in FIGS. 1 and 5. Electrically controlled positioning assembly 110 includes a two-dimensional positioning stage 120, a first one-dimensional positioning stage 130, and a second one-dimensional positioning stage 140.

With continued reference to FIGS. 1 and 5, two-dimensional positioning stage 120 may be configured to selectively position a positioned assembly 126. This may include selectively positioning the positioned assembly along a first two-dimensional positioning axis 122, such as may be parallel to the X-axis of FIG. 5, and also along a second two-dimensional positioning axis 124, such as may be parallel to the Y-axis of FIG. 5. Second two-dimensional positioning axis 124 may be perpendicular, or at least substantially perpendicular, to first two-dimensional positioning axis 122. Both first two-dimensional positioning axis 122 and second two-dimensional positioning axis 124 may be parallel, or at least substantially parallel, to support surface 42 of chuck 40 and/or to an upper surface of substrate 20 when the substrate is supported by the chuck.

Figure 6:
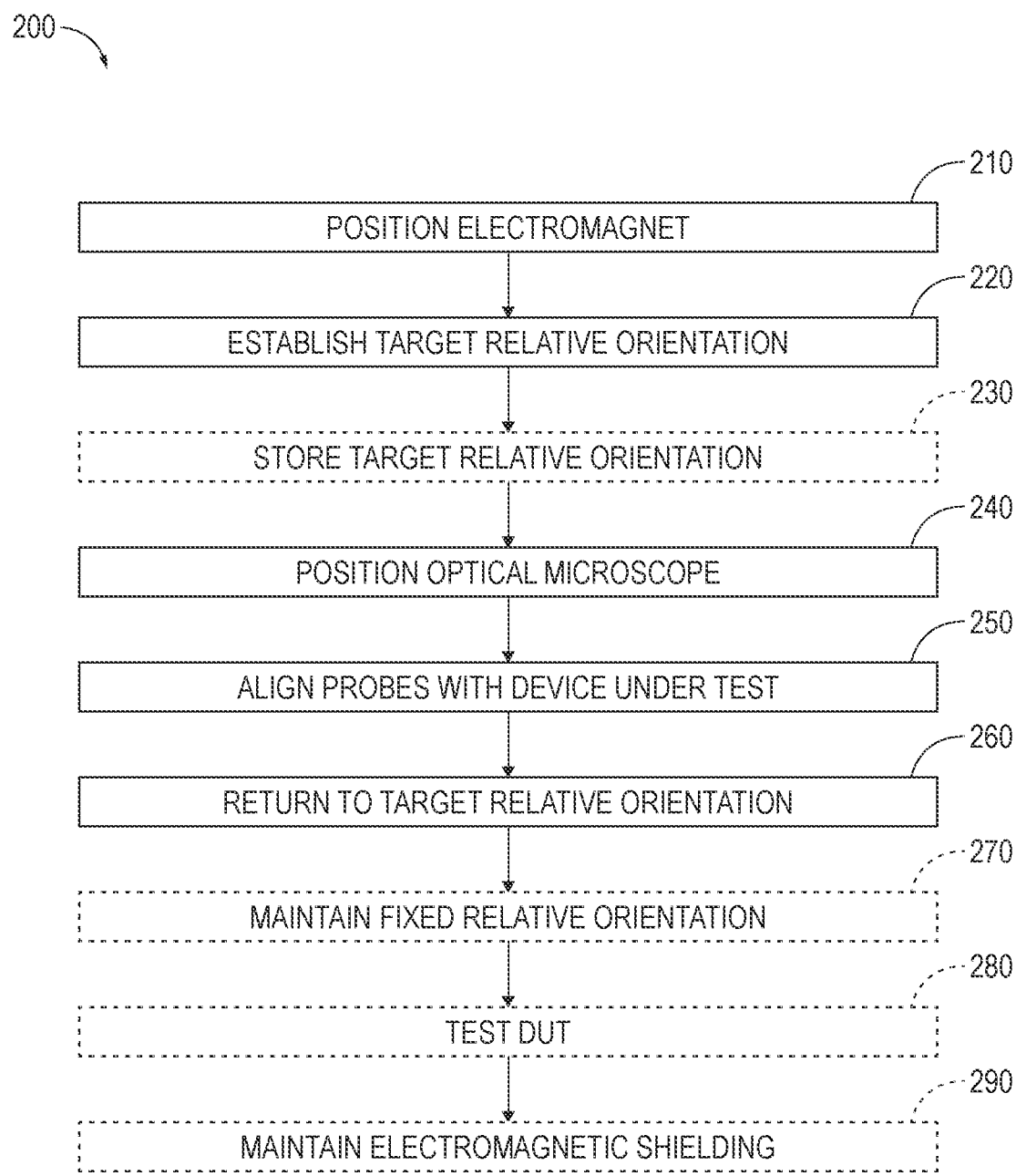
FIG. 6 is a flowchart depicting examples of methods of operating a probe system, according to the present disclosure.

With continued reference to FIG. 6, first one-dimensional positioning stage 130 may operatively attach optical microscope 90 to positioned assembly 126 and/or may be configured to selectively position the optical microscope along a first one-dimensional positioning axis 132. Second one-dimensional positioning stage 140 may operatively attach electromagnet 100 to positioned assembly 126 and/or may be configured to selectively position the electromagnet along a second one-dimensional positioning axis 142. First one-dimensional positioning axis 132 and/or second one-dimensional positioning axis 142 may be parallel, or at least substantially parallel, to one another, may be parallel, or at least substantially parallel, to the Z-axis of FIG. 5, and/or may be perpendicular, or at least substantially perpendicular, to support surface 42 of chuck 40 and/or to the upper surface of substrate 20 when the substrate is supported by the chuck.

Enclosure 30 may include any suitable structure that may at least partially define enclosed volume 32, that may shield the enclosed volume from ambient electromagnetic radiation, and/or that may shield an ambient environment, which surrounds probe system 10, from electromagnetic radiation and/or from magnetic fields generated within the enclosed volume. As an example, enclosure 30 may include and/or may be formed from an enclosure material 36, as illustrated in FIGS. 1 and 5. Enclosure material 36 may include and/or be an electromagnetically shielding material, an electromagnetically reflective material, an electromagnetically absorptive material, a magnetic shielding material, a magnetically reflective material, and/or a magnetically absorptive material. Enclosure 30 also may be referred to herein as a housing 30, an electromagnetically shielded housing 30, a surround 30, and/or an electromagnetically shielded surround 30.

In some examples, enclosure 30 may define an aperture 34, as illustrated in FIGS. 1 and 5. Aperture 34, when present, may be shaped, sized, positioned, and/or configured to provide access to enclosed volume 32. As examples, and in some configurations, optical microscope 90 may be positioned at least partially within aperture 34, microscope optical axis 92 may extend through aperture 34, electromagnet 100 may be configured to apply magnetic field 102 to DUT 22 via aperture 34, the electromagnet may be positioned at least partially within the aperture, and/or at least a region of probe assembly 60 may extend within and/or through the aperture. In some examples, electronically controlled positioning assembly 110 may be external, or at least partially external, enclosed volume 32 and/or aperture 34.

Chuck 40 may include any suitable structure that may include and/or define support surface 42 and/or that may be sized, configured, and/or shaped to support substrate 20. In some examples, and as discussed, chuck 40 may include and/or be temperature-controlled chuck 40. In some such examples, chuck 40 may include and/or may be in thermal communication with a chuck temperature controller 48, which may be configured to selectively control and/or regulate a temperature of the chuck, of the substrate, and/or of DUT 22.

In some examples, and as illustrated in FIG. 5, chuck 40 may include and/or be a triaxial chuck 40. In some such configurations, chuck 40 may include a plurality of chuck layers 44. In a specific example, chucks layers 44 may include alternating, or interleaved, electrically insulating chuck layers 44 and electrically conductive chuck layers 44, with the electrically conductive chuck layers being maintained at different electrical potentials, such as relative to one another, in order to provide electromagnetic shielding to substrate 20 and/or to DUT 22.

In some examples, probe systems 10 and/or chucks 40 may include a chuck positioning stage 50, as illustrated in FIG. 5. Chuck positioning stage 50, when present, may be configured to selectively move, translate, and/or rotate chuck 40 relative to probe assembly 60, relative to optical microscope 90, and/or relative to electromagnet 100. Examples of chuck positioning stage 50 include any suitable linear actuator and/or rotary actuator.

Optical microscope 90 may include any suitable structure that may be adapted, configured, designed, and/or constructed to collect and/or generate the microscope optical image. As examples, optical microscope 90 may include a lens, an objective, a mirror, and/or an optical imaging device, such as a camera and/or a charge coupled device.

In some examples, and as illustrated, optical microscope 90 may be positioned external, or at least partially external, enclosed volume 32. Additionally or alternatively, electronically controlled positioning assembly 110 may be configured to selectively position optical microscope 90 within and/or proximate aperture 34, such as to permit and/or facilitate collection of the microscope optical image by the optical microscope.

Electromagnet 100 may include any suitable structure that may be adapted, configured, designed, and/or constructed to produce, to generate, to emit, to selectively produce, to selectively generate, and/or to selectively emit magnetic field 102 and/or to apply the magnetic field to the DUT. As examples, electromagnet 100 may include an electric current source and/or a coil of electrically conductive material, such as a metal coil.

In some examples, and as illustrated, electromagnet 100 may be positioned external, or at least partially external, enclosed volume 32. Additionally or alternatively, electronically controlled positioning assembly 110 may be configured to selectively position electromagnet 100 within and/or proximate aperture 34, such as to permit and/or facilitate application of the magnetic field to the DUT by the electromagnet.

Electronically controlled positioning assembly 110 may include any suitable structure that may include two-dimensional positioning stage 120, first one-dimensional positioning stage 130, and/or second one-dimensional positioning stage 140. Additionally or alternatively, electronically controlled positioning assembly 110 may include any suitable structure that may be adapted, configured, designed, and/or constructed to selectively position, or to independently position, optical microscope 90 and/or electromagnet 100 relative to substrate 20 and/or DUT 22. This may include selective positioning of the optical microscope and/or of the electromagnet in one, two, and/or three dimensions, such as along the X-axis, the Y-axis, and/or the Z-axis of FIG. 5. Examples of structures that may be included in and/or utilized with electronically controlled positioning assembly 110, two-dimensional positioning stage 120, first one-dimensional positioning stage 130, and/or second one-dimensional positioning stage 140 include a lead screw and nut, a ball screw and nut, a rack and pinion assembly, a linear actuator, a piezoelectric actuator, and/or a stepper motor.

In some examples, electronically controlled positioning assembly 110 may be configured to maintain a constant, or an at least substantially constant, distance 112 between electromagnet 100 and optical microscope 90, as illustrated in FIGS. 1 and 5. Distance 112 may be measured along first two-dimensional positioning axis 122, along second two-dimensional positioning axis 124, and/or within a plane that is defined by the first two-dimensional positioning axis and the second two-dimensional positioning axis.

In some examples, and as perhaps best illustrated in FIGS. 3 and 5, probe systems 10 may include a camera 150, which also may be referred to herein as an upward-looking camera 150. Camera 150, when present, may be configured to collect a camera optical image along a camera optical axis 152 that is directed away from, or normal to, support surface 42, as illustrated in FIG. 5. As also illustrated, camera 150 may be positioned within enclosed volume 32 and/or may be offset, or laterally offset, from support surface 42. In some examples, camera 150 may be configured to collect the camera optical image of probes 62, of a DUT-facing side 96 of optical microscope 90, and/or of a DUT-facing side 106 of electromagnet 100. This may include collection of the camera optical image when probes 62, optical microscope 90, and/or electromagnet 100 are positioned and/or aligned along camera optical axis 152.

As an example, probe systems 10 may be configured to selectively position probes 62, optical microscope 90, and/or electromagnet 100 proximate and/or above camera 150 to permit and/or facilitate the collection of the camera optical image. This selective positioning may be facilitated and/or accomplished utilizing chuck positioning stage 50 to move and/or to position camera 150, utilizing electronically controlled positioning assembly 110 to move and/or to position microscope 90 and/or electromagnet 100, and/or utilizing manipulators 66 to move probes 62.

In some examples, and as perhaps best illustrated in FIGS. 2-3 and 5, probe systems 10 may include a magnetic field strength meter 162. Magnetic field strength meter 162, when present, may be configured to quantify a magnetic field strength of magnetic field 102 produced by electromagnet 100. As an example, probe systems 10 may be configured to selectively position electromagnet 100 proximate and/or above (e.g., along the Z-axis of FIG. 5) magnetic field strength meter 162 to permit and/or facilitate the quantification of the magnetic field strength. Examples of magnetic field strength meter 162 include a Hall sensor and/or a 3-axis magnetic field strength meter.

As illustrated, magnetic field strength meter 162 may be positioned within enclosed volume 32 and/or may be offset, or laterally offset, from support surface 42. In some examples, probe systems 10 may include an auxiliary chuck 160 that may be laterally offset from the support surface, and magnetic field strength meter 162 may form a portion of and/or may be defined on the auxiliary chuck.

In some examples, and as perhaps best illustrated in FIG. 5, probe system 10 and/or electromagnet 100 thereof may include a magnet temperature control assembly 108. Magnet temperature control assembly 108, when present, may be configured to maintain electromagnet 100 within a magnet operating temperature range, such as by selectively heating and/or cooling the magnet to maintain the magnet within the magnet operating temperature range.

In some examples, and as discussed, chuck 40 may include and/or be a temperature-controlled chuck, which may be configured to selectively regulate a DUT temperature of DUT 22. In some such configurations, magnet temperature control assembly 108 may be configured to maintain the magnet within the magnet operating temperature range independent of the DUT temperature. Stated another way, probe systems 10 may be configured to independently control and/or regulate the temperature of electromagnet 100 and of DUT 22. Such a configuration may permit and/or facilitate operation of electromagnet 100 when DUT 22 is maintained at DUT temperatures that are outside, or that would cause electromagnet 100 to be outside, a target, designated, or specified magnet operating temperature range.

As discussed in more detail herein, probe systems 10 include electromagnet 100, which may be utilized to apply a magnetic field to DUT 22 during testing of the DUT. With this in mind, one or more components of probe systems 10 may include, may be formed from, or may be completely formed from a corresponding material and/or materials that is not magnetically active, that is non-magnetic, and/or that is nonferrous. Such a configuration may decrease a potential for disruption of and/or non-uniformities in magnetic field 102.

As an example, enclosure 30 may be formed from, or completely formed from, one or more enclosure materials 36, which may be non-magnetic enclosure materials and/or nonferrous enclosure materials. As another example, chuck 40 may be formed from, or completely formed from, one or more chuck materials 46, which may be non-magnetic chuck materials and/or nonferrous chuck materials. As yet another example, probe assembly 60 may be formed from, or completely formed from, one or more probe assembly materials 70, which may be non-magnetic probe assembly materials and/or nonferrous probe assembly materials. As another example, optical microscope 90 may be formed from, or completely formed from, one or more microscope materials 94, which may be non-magnetic microscope materials and/or nonferrous microscope materials. As yet another example, electromagnet 100 may be formed from, or completely formed from, one or more magnet materials 104, which may be non-magnetic magnet materials and/or nonferrous magnet materials. As another example, electronically controlled positioning assembly 110 may be formed from, or completely formed from, one or more positioning assembly materials 114, which may be non-magnetic positioning assembly materials and/or nonferrous positioning assembly materials.

As illustrated in FIG. 5, probe systems 10 may include a signal generation and analysis assembly 80. Signal generation and analysis assembly 80, when present, may be adapted, configured, designed, and/or programmed to generate test signal 82, to receive resultant signal 84, and/or to quantify the operation of DUT 22 based, at least in part, on test signal 82 and/or on resultant signal 84.

As also illustrated in FIG. 5, probe systems 10 may include a controller 170. Controller 170, when present, may be adapted, configured, designed, and/or programmed to control the operation of at least one other component of the probe system. As examples, controller 170 may be programmed to control the operation of temperature-controlled chuck 40, of probe assembly 60, of optical microscope 90, of electromagnet 100, of electronically controlled positioning assembly 110, of camera 150, and/or of magnetic field strength meter 162.

During operation of probe systems 10, electronically controlled positioning assembly 110 and/or camera 150 may be utilized to accurately position probes 62 and/or electromagnet 100 relative to DUT 22 while electromagnet 100 extends within and/or through aperture 34. Stated another way, probe systems 10 permit and/or facilitate accurate positioning and/or alignment among probes 62, electromagnet 100, and DUT 22 when optical microscope 90 is unable to view the probes and/or the electromagnet. This may permit and/or facilitate testing of one or more DUTs 22 by probe systems 10 while maintaining electromagnetic shielding around the DUT. Such a configuration may be in contrast with prior art probe systems, which require that the enclosure be opened and/or that the electromagnetic shielding be "broken" in order to manually reposition the magnet. In addition, electronically controlled positioning assembly 110 and camera 150 may permit and/or facilitate much more accurate alignment among probes 62, electromagnet 100, and DUT 22 when compared to prior art probe systems.

As an example, electromagnet 100 may be positioned above and/or within aperture 34 and above probes 62. In addition, camera 150 may be positioned below both probes 62 and electromagnet 100 and may be utilized to determine and/or to establish a precise relative orientation, in three dimensions, between the probes and the electromagnet. Subsequently, optical microscope 90 may be positioned above and/or within aperture 34 and may be utilized to align probes 62 with DUT 22. Then, electromagnet 100 may be repositioned above, may be repositioned within aperture 34, and/or may be returned to its position prior to alignment between probes 62 and DUT 22. The electromagnet then may be utilized to apply magnetic field 102 to DUT 22 during testing of the DUT by probes 62.

Electronically controlled positioning assembly 110 may be utilized to position electromagnet 100 and optical microscope 90 during the above-described operations. As discussed, electronically controlled positioning assembly 110 is configured to maintain a fixed, or at least substantially fixed, distance and/or relative orientation between the electromagnet and the optical microscope, at least within a plane that is defined by first two-dimensional positioning axis 122 and second two-dimensional positioning axis 124. As such, knowledge of the positions of the various components of the electronically controlled positioning assembly during initial alignment between electromagnet 100 and probes 62 may permit subsequent realignment between the electromagnet and the probes without the need to view the electromagnet and/or the probes utilizing camera 150, thereby permitting the alignment between the probes and the DUT to be maintained.

FIG. 6 is a flowchart depicting additional examples of methods 200 of operating a probe system, according to the present disclosure. Methods 200 include positioning an electromagnet at 210 and establishing a target relative orientation at 220. Methods 200 may include storing the target relative orientation at 230, and methods 200 include positioning an optical microscope at 240 and aligning probes with a device under test at 250. Methods 200 also include returning to the target relative orientation at 260 and may include maintaining a fixed relative orientation at 270, testing a DUT at 280, and/or maintaining electromagnetic shielding at 290.

Positioning the electromagnet at 210 may include positioning the electromagnet at least partially above and/or proximate an aperture of an electromagnetically shielded enclosure of the probe system. Stated differently, the positioning at 210 may include positioning the electromagnet such that a magnetic field, which is produced by the electromagnet, extends into the enclosure and/or is applied to a device under test (DUT) that is positioned to be tested by the probe system. In some examples, the positioning at 210 may include positioning the electromagnet with, via, and/or utilizing an electronically controlled positioning assembly of the probe system. In some examples, the positioning at 210 may include moving a positioned assembly, which includes the electromagnet and the optical microscope. In some examples, the positioning at 210 may include maintaining a fixed, or at least substantially fixed, distance between the electromagnet and the optical assembly, such as during the moving.

Examples of the electromagnet are disclosed herein with reference to electromagnet 100. Examples of the electromagnetically shielded enclosure and the aperture are disclosed herein with reference to electromagnetically shielded enclosure 30 and aperture 34, respectively. Examples of the DUT are disclosed herein with reference to DUT 22. Examples of the electronically controlled positioning assembly are disclosed herein with reference to electronically controlled positioning assembly 110. Examples of the positioned assembly are disclosed herein with reference to positioned assembly 126. Examples of the optical microscope are disclosed herein with reference to optical microscope 90. Examples of the fixed, or at least substantially fixed, distance between the electromagnet and the optical assembly are disclosed herein with reference to distance 112.

Establishing the target relative orientation at 220 may include establishing the target relative orientation between the electromagnet and a plurality of probes of a probe assembly of the probe system. In some examples, the establishing at 220 may include viewing both the electromagnet and the plurality of probes via a camera. The camera may define a camera optical axis, which may face toward a DUT-facing side of the electromagnet.

The establishing at 220 may include establishing the target relative orientation while the electromagnet is positioned within the aperture, while the electromagnet is positioned proximate the aperture, and/or while the electromagnet is positioned such that the optical microscope is unable to collect an optical image through the aperture. Stated differently, and during the establishing at 220, a microscope optical axis of the optical microscope may be external the aperture, the microscope optical axis is spaced apart from the aperture, the microscope is unable to view the DUT via the aperture, and/or the electromagnet may be proximate the aperture relative to the optical microscope. With this in mind, the establishing at 220 may include establishing the target relative orientation without, or without utilizing, the optical microscope.

Examples of the plurality of probes are disclosed herein with reference to probes 62. Examples of the probe assembly are disclosed herein with reference to probe assembly 60. Examples of the camera are disclosed herein with reference to camera 150.

Storing the target relative orientation at 230 may include storing, saving, and/or otherwise retaining the target relative orientation. In some examples, the storing at 230 may include electronically storing the target relative orientation, such as via a controller that performs at least a subset of methods 200 and/or that controls the probe system. In some examples, the storing at 230 may include storing the target relative orientation to permit and/or facilitate the returning at 260. Examples of the controller are disclosed herein with reference to controller 170.

Positioning the optical microscope at 240 may include positioning the optical microscope such that the microscope optical axis of the optical microscope extends through the aperture, is incident upon the plurality of probes, and/or is incident upon the DUT. In some examples, the positioning at 240 may include positioning with, via, and/or utilizing the electronically controlled positioning assembly. In some examples, the positioning at 240 may include moving the positioned assembly. In some such examples, the moving may include moving while maintaining the fixed, or at least substantially fixed, distance between the electromagnet and the optical microscope.

Aligning probes with the DUT at 250 may include aligning the plurality of probes with any suitable structure that may be formed on and/or defined by the DUT. As an example, the plurality of probes may include a plurality of optical probes. In such examples, the aligning at 250 may include aligning the plurality of optical probes with a corresponding plurality of coupling structures on the DUT. As another example, the plurality of probes may include a plurality of electrical probes. In such examples, the aligning at 250 may include aligning the plurality of electrical probes with a corresponding plurality of contact locations on the DUT.

The aligning at 250 may include observing, visually observing, and/or optically observing the plurality of probes and the DUT with the optical microscope, via the aperture, and/or along the microscope optical axis. The microscope optical axis may extend toward and/or may be incident upon a planar substrate surface of a substrate that includes and/or defines the DUT.

In some examples, the aligning at 250 may include moving at least one probe of the plurality of probes, such as may be accomplished utilizing a manipulator of the probe assembly.

In some examples, the aligning at 250 may include moving the DUT, such as may be accomplished utilizing a chuck positioning stage of the probe system.

The positioning at 240 may include moving the electromagnet away from the aperture to permit and/or facilitate observation of the plurality of probes and the DUT with the optical microscope. Stated differently, the probe systems may be configured such that only one of the electromagnet and the optical microscope may be positioned within and/or above the aperture at a given point in time; and, during the aligning at 250, the optical microscope may be positioned within the aperture, may be positioned above the aperture, and/or may be proximate the aperture relative to the electromagnet. With this in mind, the aligning at 250 may be performed while the electromagnet is external the aperture, while the electromagnet is spaced apart from the aperture, while the DUT-facing side of the electromagnet is spaced apart from the aperture, while the DUT-facing side of the electromagnet is external the aperture, and/or while the DUT-facing side of the electromagnet does not face into the aperture.

Examples of the substrate are disclosed herein with reference to substrate 20. Examples of the DUT are disclosed herein with reference to DUT 22. Examples of the manipulator are disclosed herein with reference to manipulator 66. Examples of the chuck positioning stage are disclosed herein with reference to chuck positioning stage 50. Returning to the target relative orientation at 260 may include returning the electromagnet and the plurality of probes to the target relative orientation, such as may be established during the establishing at 220, and may be performed subsequent to the aligning at 250. This may include moving the positioned assembly and/or maintaining the fixed, or at least substantially fixed, distance between the electromagnet and the optical microscope during the moving.

Maintaining the fixed relative orientation at 270 may include maintaining a fixed, or at least substantially fixed, relative orientation between the plurality of probes and the DUT. This may include maintaining the fixed, or at least substantially fixed, relative orientation subsequent to the aligning at 250, during the returning at 260, during the testing at 280, and/or during the maintaining at 290. Stated differently, and during the establishing at 220, the target relative orientation between the electromagnet and the plurality of probes may be determined, established, and/or remembered. In addition, and during the aligning at 250, the plurality of probes may be aligned with the DUT. This alignment may be maintained, during the returning at 260, so that the electromagnet, the plurality of probes, and the DUT all may exhibit a desired, target, or predetermined relative orientation despite the fact that the probe systems may be incapable of simultaneously viewing the electromagnet, the plurality of probes, and the DUT.

As discussed, the maintaining at 270 additionally or alternatively may include maintaining the fixed, or at least substantially fixed, distance between the electromagnet and the optical microscope. This may include maintaining the fixed, or at least substantially fixed, distance during the positioning at 210, during the establishing at 220, during the storing at 230, during the positioning at 240, during the aligning at 250, during the returning at 260, during the testing at 280, and/or during the maintaining at 290. This may include maintaining a fixed relative orientation between the electromagnet and the optical microscope in three dimensions and/or maintaining the fixed relative orientation between the electromagnet and the optical microscope within a plane that extends perpendicular, or at least substantially perpendicular, to the microscope optical axis.

Testing at DUT at 280 may include testing the DUT with the probe system. This may include testing the DUT with, via, and/or utilizing the plurality of probes and/or testing the probe system while applying a magnetic field to the DUT with the electromagnet. Stated differently, the testing at 280 further may include applying the magnetic field to the DUT with the electromagnet, and the applying the magnetic field may be performed at least partially concurrently with supply of a test signal to the DUT, via at least one probe of the plurality of probes, and/or receipt of a resultant signal from the DUT, via at least one probe of the plurality of probes.

The DUT may be positioned within the electromagnetically shielded enclosure. Stated differently, methods 200 may include electromagnetically shielding the DUT, with the electromagnetically shielded enclosure, during at least a subset of methods 200. In a specific example, methods 200 may include maintaining the electromagnetic shielding, at 290, during an entirety of methods 200. This may be in contrast to prior art probe systems, which may require that electromagnetic shielding be broken in order to permit alignment between corresponding probes and a corresponding DUT and/or between corresponding probes and a corresponding electromagnet.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of probe systems according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe system configured to test a device under test (DUT), the probe system comprising:

an electromagnetically shielded enclosure that defines an enclosed volume;

a temperature-controlled chuck that defines a support surface configured to support a substrate that includes the DUT, wherein the support surface is positioned within the enclosed volume;

a probe assembly including a plurality of probes configured to at least one of provide a test signal to the DUT and receive a resultant signal from the DUT;

an optical microscope configured to collect a microscope optical image of the DUT along a microscope optical axis that is directed toward the support surface;

an electromagnet configured to selectively apply a magnetic field to the DUT; and an electronically controlled positioning assembly including:

(i) a two-dimensional positioning stage configured to selectively position a positioned assembly optionally along a first two-dimensional positioning axis and also along a second two-dimensional positioning axis that is perpendicular, or at least substantially perpendicular, to the first two-dimensional positioning axis, wherein both the first two-dimensional positioning axis and the second two-dimensional positioning axis are parallel, or at least substantially parallel, to the support surface;

(ii) a first one-dimensional positioning stage that operatively attaches the optical microscope to the positioned assembly and optionally is configured to selectively position the optical microscope along a first one-dimensional positioning axis that is perpendicular, or at least substantially perpendicular, to the support surface; and (iii) a second one-dimensional positioning stage that operatively attaches the electromagnet to the positioned assembly and optionally is configured to selectively position the electromagnet along a second one-dimensional positioning axis that is perpendicular, or at least substantially perpendicular, to the support surface.

A2. The probe system of paragraph A1, wherein the electromagnetically shielded enclosure further defines an aperture configured to provide access to the enclosed volume.

A3. The probe system of paragraph A2, wherein at least one of:

(i) the microscope optical axis extends through the aperture;

(ii) the optical microscope is positioned at least partially within the aperture;

(iii) the electromagnet is configured to apply the magnetic field to the DUT via the aperture; and (iv) the electromagnet is positioned at least partially within the aperture.

A4. The probe system of any of paragraphs A2-A3, wherein the electronically controlled positioning assembly is external the enclosed volume.

A5. The probe system of any of paragraphs A1-A4, wherein the electromagnetically shielded enclosure is formed, or completely formed, from at least one of a non-magnetic enclosure material and a nonferrous enclosure material.

A6. The probe system of any of paragraphs A1-A5, wherein the temperature-controlled chuck is a triaxial temperature-controlled chuck.

A7. The probe system of any of paragraphs A1-A6, wherein the temperature-controlled chuck is formed from, or completely formed from, at least one of a non-magnetic chuck material and a nonferrous chuck material.

A8. The probe system of any of paragraphs A1-A7, wherein the probe assembly includes at least one of:

(i) a probe card; and (ii) a plurality of manipulators and a corresponding plurality of needle probes operatively attached to the plurality of manipulators.

A9. The probe system of any of paragraphs A1-A8, wherein the probe assembly is formed from, or completely formed from, at least one of a non-magnetic probe assembly material and a nonferrous probe assembly material.

A10. The probe system of any of paragraphs A1-A9, wherein the optical microscope is positioned at least partially external the enclosed volume.

A11. The probe system of any of paragraphs A1-A10, wherein the optical microscope is formed from, or completely formed from, at least one of a non-magnetic microscope material and a nonferrous microscope material.

A12. The probe system of any of paragraphs A1-A11, wherein the electromagnet is positioned at least partially external the enclosed volume.

A13. The probe system of any of paragraphs A1-A12, wherein the electromagnet is formed from, or completely formed from, at least one of a non-magnetic magnet material and a nonferrous magnet material.

A14. The probe system of any of paragraphs A1-A13, wherein the electronically controlled positioning assembly is configured to maintain a constant, or at least substantially constant, distance between the optical microscope and the electromagnet along both the first two-dimensional positioning axis and the second two-dimensional positioning axis.

A15. The probe system of any of paragraphs A1-A14, wherein the electronically controlled positioning assembly is formed from, or completely formed from, at least one of a non-magnetic positioning assembly material and a nonferrous positioning assembly material.

A16. The probe system of any of paragraphs A1-A15, wherein the electronically controlled positioning assembly includes at least one of a lead screw and nut, a ball screw and nut, a rack and pinion assembly, a linear actuator, a piezoelectric actuator, and a stepper motor.

A17. The probe system of any of paragraphs A1-A16, wherein the probe system further includes a camera configured to collect a camera optical image along a camera optical axis that is directed away from the support surface.

A18. The probe system of paragraph A17, wherein the camera is positioned within the enclosed volume.

A19. The probe system of any of paragraphs A17-A18, wherein the camera is laterally offset from the support surface.

A20. The probe system of any of paragraphs A17-A19, wherein the camera is configured to collect the camera optical image of at least one of a DUT-facing side of the optical microscope, the plurality of probes, and a DUT-facing side of the electromagnet.

A21. The probe system of any of paragraphs A1-A20, wherein the probe system further includes a magnetic field strength meter configured to quantify a magnetic field strength of the magnetic field.

A22. The probe system of paragraph A21, wherein the magnetic field strength meter is at least one of:
(i) a Hall sensor; and
(ii) a 3-axis magnetic field strength meter.

A23. The probe system of any of paragraphs A21-A22, wherein the magnetic field strength meter is laterally offset from the support surface.

A24. The probe system of any of paragraphs A21-A23, wherein the magnetic field strength meter forms a portion of an auxiliary chuck that is laterally offset from the support surface.

A25. The probe system of any of paragraphs A1-A24, wherein the probe system further includes a magnet temperature control assembly configured to maintain the magnet within a magnet operating temperature range.

A26. The probe system of paragraph A25, wherein the temperature-controlled chuck is configured to selectively regulate a DUT temperature of the DUT, and further wherein the magnet temperature control assembly is configured to maintain the magnet within the magnet operating temperature range independent of the DUT temperature.

A27. The probe system of any of paragraphs A1-A26, wherein the probe system further includes a controller programmed to control the operation of at least one other component of the probe system.

A28. The probe system of paragraph A27, wherein the controller is programmed to control the operation of at least one of:
(i) the temperature-controlled chuck;
(ii) the probe assembly;
(iii) the optical microscope;
(iv) the electromagnet;
(v) the electronically controlled positioning assembly;
(vi) a/the camera;
(vii) a/the magnetic field strength meter; and
(viii) a/the magnet temperature control assembly.

B1. A method of operating a probe system, the method comprising:
positioning, optionally with an electronically controlled positioning assembly, an electromagnet at least partially above an aperture of an electromagnetically shielded enclosure, optionally wherein the positioning the electromagnet includes moving a positioned assembly, which includes the electromagnet and an optical microscope, while maintaining a fixed, or at least substantially fixed, distance between the electromagnet and the optical microscope;
establishing a target relative orientation between the electromagnet and a plurality of probes of a probe assembly of the probe system, wherein the establishing includes viewing both the electromagnet and the plurality of probes via a camera that defines a camera optical axis that faces toward a DUT-facing side of the electromagnet;
positioning, optionally with the electronically controlled positioning assembly, the optical microscope such that a microscope optical axis of the optical microscope extends through the aperture, optionally wherein the positioning the optical microscope includes moving the positioned assembly while maintaining the fixed, or at least substantially fixed, distance between the electromagnet and the optical microscope;
aligning the plurality of probes with a device under test (DUT), wherein the aligning includes observing the plurality of probes and the DUT with the optical microscope, via the aperture, and along the microscope optical axis, and further wherein the microscope optical axis extends toward a planar substrate surface of a substrate that includes the DUT;
subsequent to the aligning, returning the electromagnet and the plurality of probes to the target relative orientation; and
optionally testing the DUT with the probe system and via the plurality of probes while applying a magnetic field to the DUT with the electromagnet.

B2. The method of paragraph B1, wherein the method further includes electronically storing the target relative orientation to facilitate the returning the electromagnet and the plurality of probes to the target relative orientation.

B3. The method of any of paragraphs B1-B2, wherein the aligning the plurality of probes with the DUT includes at least one of:
(i) moving at least one probe of the plurality of probes utilizing a manipulator of the probe assembly; and
(ii) moving the DUT utilizing a chuck positioning stage of the probe system.

B4. The method of any of paragraphs B1-B3, wherein, subsequent to the aligning the plurality of probes with the DUT, the method further includes maintaining a fixed relative orientation between the plurality of probes and the DUT during the returning and optionally during the testing.

B5. The method of any of paragraphs B1-B4, wherein, during the establishing the target relative orientation, at least one of:
(i) the microscope optical axis is external the aperture;
(ii) the microscope optical axis is spaced apart from the aperture;
(iii) the microscope is unable to view the DUT via the aperture; and
(iv) the electromagnet is proximate the aperture relative to the optical microscope.

B6. The method of any of paragraphs B1-B5, wherein, during the aligning, at least one of:
(i) the electromagnet is external the aperture;
(ii) the electromagnet is spaced apart from the aperture;
(iii) the DUT-facing side of the electromagnet is spaced apart from the aperture;
(iv) the DUT-facing side of the electromagnet is external the aperture;
(v) the DUT-facing side of the electromagnet does not face into the aperture; and
(vi) the optical microscope is proximate the aperture relative to the electromagnet.

B7. The method of any of paragraphs B1-B6, wherein the DUT is positioned within the electromagnetically shielded enclosure.

B8. The method of paragraph B7, wherein the method includes maintaining electromagnetic shielding of the DUT, via the electromagnetically shielded enclosure, during an entirety of the method.

B9. The method of any of paragraphs B1-B8, wherein the maintaining the fixed, or at least substantially fixed, distance between the electromagnet and the optical microscope includes at least one of:
(i) maintaining a fixed relative orientation between the electromagnet and the optical microscope in three dimensions; and
(ii) maintaining a fixed relative orientation between the electromagnet and the optical microscope within a plane that extends perpendicular, or at least substantially perpendicular, to the microscope optical axis.

B10. The method of any of paragraphs B1-B9, wherein the probe system includes any suitable structure of any of the probe systems of any of paragraphs A1-A28.

INDUSTRIAL APPLICABILITY

The probe systems and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system configured to test a device under test (DUT), the probe system comprising:
   an electromagnetically shielded enclosure that defines an enclosed volume;
   a temperature-controlled chuck that defines a support surface configured to support a substrate that includes the DUT, wherein the support surface is positioned within the enclosed volume;
   a probe assembly including a plurality of probes configured to at least one of provide a test signal to the DUT and receive a resultant signal from the DUT;
   an optical microscope configured to collect a microscope optical image of the DUT along a microscope optical axis that is directed toward the support surface;
   an electromagnet configured to selectively apply a magnetic field to the DUT; and
   an electronically controlled positioning assembly including:
   (i) a two-dimensional positioning stage configured to selectively position a positioned assembly along a first two-dimensional positioning axis and also along a second two-dimensional positioning axis that is at least substantially perpendicular to the first two-dimensional positioning axis, wherein both the first two-dimensional positioning axis and the second two-dimensional positioning axis are at least substantially parallel to the support surface;
   (ii) a first one-dimensional positioning stage that operatively attaches the optical microscope to the positioned assembly and is configured to selectively position the optical microscope along a first one-dimensional positioning axis that is at least substantially perpendicular to the support surface; and
   (iii) a second one-dimensional positioning stage that operatively attaches the electromagnet to the positioned assembly and is configured to selectively position the electromagnet along a second one-dimensional positioning axis that is at least substantially perpendicular to the support surface.

2. The probe system of claim 1, wherein the electromagnetically shielded enclosure further defines an aperture configured to provide access to the enclosed volume.

3. The probe system of claim 2, wherein at least one of:
   (i) the microscope optical axis extends through the aperture;
   (ii) the optical microscope is positioned at least partially within the aperture;
   (iii) the electromagnet is configured to apply the magnetic field to the DUT via the aperture; and
   (iv) the electromagnet is positioned at least partially within the aperture.

4. The probe system of claim 2, wherein the electronically controlled positioning assembly is external the enclosed volume.

5. The probe system of claim 1, wherein the electromagnetically shielded enclosure is completely formed from a non-magnetic enclosure material.

6. The probe system of claim 1, wherein the temperature-controlled chuck is completely formed from a non-magnetic chuck material.

7. The probe system of claim 1, wherein the probe assembly is completely formed from a non-magnetic probe assembly material.

8. The probe system of claim 1, wherein the optical microscope is completely formed from a non-magnetic microscope material.

9. The probe system of claim 1, wherein the electromagnet is completely formed from a non-magnetic magnet material.

10. The probe system of claim 1, wherein the electronically controlled positioning assembly is configured to maintain an at least substantially constant distance between the optical microscope and the electromagnet along both the first two-dimensional positioning axis and the second two-dimensional positioning axis.

11. The probe system of claim 1, wherein the electronically controlled positioning assembly is completely formed from a non-magnetic positioning assembly material.

12. The probe system of claim 1, wherein the probe system further includes a camera configured to collect a camera optical image along a camera optical axis that is directed away from the support surface.

13. The probe system of claim 12, wherein the camera is positioned within the enclosed volume.

14. The probe system of claim 13, wherein the camera is laterally offset from the support surface.

15. The probe system of claim 12, wherein the camera is configured to collect the camera optical image of at least one of a DUT-facing side of the optical microscope, the plurality of probes, and a DUT-facing side of the electromagnet.

16. The probe system of claim 1, wherein the probe system further includes a magnetic field strength meter configured to quantify a magnetic field strength of the magnetic field.

17. The probe system of claim 16, wherein the magnetic field strength meter is laterally offset from the support surface.

18. The probe system of claim 1, wherein the probe system further includes an electromagnet temperature control assembly configured to maintain the electromagnet within an electromagnet operating temperature range.

19. The probe system of claim 18, wherein the temperature-controlled chuck is configured to selectively regulate a DUT temperature of the DUT, and further wherein the electromagnet temperature control assembly is configured to maintain the electromagnet within the electromagnet operating temperature range independent of the DUT temperature.

20. A method of operating a probe system, the method comprising:

positioning, with an electronically controlled positioning assembly, an electromagnet at least partially above an aperture of an electromagnetically shielded enclosure, wherein the positioning the electromagnet includes moving a positioned assembly, which includes the electromagnet and an optical microscope, while maintaining an at least substantially fixed distance between the electromagnet and the optical microscope;

establishing a target relative orientation between the electromagnet and a plurality of probes of a probe assembly of the probe system, wherein the establishing includes viewing both the electromagnet and the plurality of probes via a camera that defines a camera optical axis that faces toward a DUT-facing side of the electromagnet;

positioning, with the electronically controlled positioning assembly, the optical microscope such that a microscope optical axis of the optical microscope extends through the aperture, wherein the positioning the optical microscope includes moving the positioned assembly while maintaining the at least substantially fixed distance between the electromagnet and the optical microscope;

aligning the plurality of probes with a device under test (DUT), wherein the aligning includes observing the plurality of probes and the DUT with the optical microscope, via the aperture, and along the microscope optical axis, and further wherein the microscope optical axis extends toward a planar substrate surface of a substrate that includes the DUT;

subsequent to the aligning, returning the electromagnet and the plurality of probes to the target relative orientation; and testing the DUT with the probe system and via the plurality of probes while applying a magnetic field to the DUT with the electromagnet.

* * * * *